United States Patent
Pervez et al.

(10) Patent No.: US 8,116,711 B2
(45) Date of Patent: Feb. 14, 2012

(54) RECEIVER SYSTEM AND METHOD THAT DETECTS AND ATTENUATES NOISE IN A PREDETERMINED FREQUENCY RANGE

(75) Inventors: Rohail A. Pervez, Kokomo, IN (US); Jeff N. Tran, Kokomo, IN (US); Daniel T. Altizer, Carmel, IN (US)

(73) Assignee: Delphi Technologies, Inc., Troy, MI (US)

( * ) Notice: Subject to any disclaimer, the term of this patent is extended or adjusted under 35 U.S.C. 154(b) by 1192 days.

(21) Appl. No.: 11/881,424

(22) Filed: Jul. 27, 2007

(65) Prior Publication Data

US 2009/0029665 A1    Jan. 29, 2009

(51) Int. Cl.
*H04B 1/16* (2006.01)
(52) U.S. Cl. ............... 455/234.1; 455/237.1; 455/238.1
(58) Field of Classification Search ................ 455/230, 455/232.1, 234.1, 234.2, 237.1, 238.1, 245.1, 455/297, 345
See application file for complete search history.

(56) References Cited

U.S. PATENT DOCUMENTS

| | | | |
|---|---|---|---|
| 6,347,146 B1 | 2/2002 | Short et al. | |
| 7,397,357 B2 * | 7/2008 | Krumm et al. | 340/501 |
| 2005/0215212 A1 * | 9/2005 | Uryu | 455/165.1 |
| 2006/0166633 A1 | 7/2006 | Mehr | |
| 2008/0165899 A1 * | 7/2008 | Rahman et al. | 375/319 |

FOREIGN PATENT DOCUMENTS

JP         8-274663         10/1996

OTHER PUBLICATIONS

European Search Report dated Mar. 8, 2011.

* cited by examiner

*Primary Examiner* — Christian Hannon
(74) *Attorney, Agent, or Firm* — Paul W. Thiede

(57) ABSTRACT

A receiver system and method for detecting and attenuating noise in a predetermined frequency range. The system includes at least one antenna, at least one filter, at least one automatic gain control device, and at least one processor. The at least one antenna receives at least one signal that includes at least one AM signal. The signal passes through the at least one filter. The at least one automatic gain control device adjusts the gain of the at least one signal to attenuate noise in the at least one signal. The at least one processor performs the steps including detecting when said noise is within a predetermined frequency range, and commanding the at least one automatic gain control device when the detected noise is within the predetermined frequency range, such that the automatic gain control device attenuates the noise that is within the predetermined frequency range.

16 Claims, 5 Drawing Sheets

RECEIVER SYSTEM AND METHOD THAT DETECTS AND ATTENUATES NOISE IN A PREDETERMINED FREQUENCY RANGE

TECHNICAL FIELD

The present invention generally relates to a receiver system, and more particularly, to a receiver system that detects and attenuates noise in a predetermined frequency range.

BACKGROUND OF THE DISCLOSURE

When communicating wirelessly, the wireless signal can encounter different types of interference. Generally, the interference can result in the signal being distorted and creating noise or emitting an undesirable output. One example of such interference is electromagnetic interference (EMI), which can be created by a variety of electrical sources. EMI can distort the signal and create noise in the signal, which can effect the output that is emitted based upon the received signal.

Generally, the interference or EMI can cause a receiver that is receiving the signal to perform at undesirable signal-to-noise ratios. This can typically result in the receiver emitting an undesirable output based upon the signal. Generally, different types of interference can have different affects on the signal, and different receivers can contain different components for attenuating the interference.

One example of interference that can effect a wireless signal is the EMI generated by high voltage electrical power lines. Generally, due to the high voltage transmissions in power lines, the electromagnetic fields surrounding the power lines can adversely impact wireless signals. Receivers receiving wireless signals in the vicinity of power lines may have undesirable outputs based upon the received signal due to the EMI also received by the receiver.

SUMMARY OF THE INVENTION

According to one aspect of the present invention, a receiver system is provided that includes at least one antenna, at least one filter, at least one automatic gain control device, and at least one processor. The at-least-one antenna receives at least one signal that includes at least one amplitude modulated (AM) signal. The at-least-one filter is in communication with the at-least-one antenna, and the signal passes through the at-least-one filter. The at-least-one automatic gain control device is in communication with the at-least-one filter, and adjusts the gain of the at-least-one signal to attenuate noise in the at-least-one signal. The at-least-one processor is in communication with the at-least-one automatic gain control device, and the at-least-one processor performs the steps including detecting when the noise is within a predetermined frequency range, and commanding the at-least-one automatic gain control device to attenuate the noise within the predetermined frequency range when the detected noise is within the predetermined frequency range, such that the automatic gain control device attenuates the noise that is within the predetermined frequency range.

According to another aspect of the present invention, a method of attenuating noise in a received signal is provided. The method includes the steps of receiving at least one signal, which includes at least one amplitude modulated signal (AM), converting the at-least-one signal to a digital signal, and filtering a desirable portion of the digitized signal, such that noise in a predetermined frequency range remains. The method further includes the steps of detecting a peak of the noise, comparing the detected peak of the noise to the digitized signal, and commanding an automatic gain control device to attenuate the noise within the predetermined frequency range when the detected noise is within the predetermined frequency range.

According to yet another aspect of the present invention, a method of attenuating noise in a signal received with a receiver system integrated with a vehicle is provided. The method includes the steps of receiving at least one signal, that includes at least one amplitude modulated (AM) signal, filtering undesirable noise from the at-least-one signal, and converting the at-least-one signal to a digital signal. The method further includes the steps of filtering a desirable portion of the digitized signal, detecting a peak of remaining noise at a predetermined frequency in the digitized signal, wherein the predetermined frequency is one of approximately fifty hertz (50 Hz) and sixty hertz (60 Hz), and outputting a maximum output based upon the detected peaks and a minimum output based upon the detected peaks. Additionally, the method can further include the steps of multiplying the maximum output and the minimum output, comparing the multiplied output to the digitized signal, and commanding an automatic gain control device to attenuate noise within a predetermined frequency range when the noise is within the predetermined frequency range.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF PREFERRED EMBODIMENTS

Figure 1:
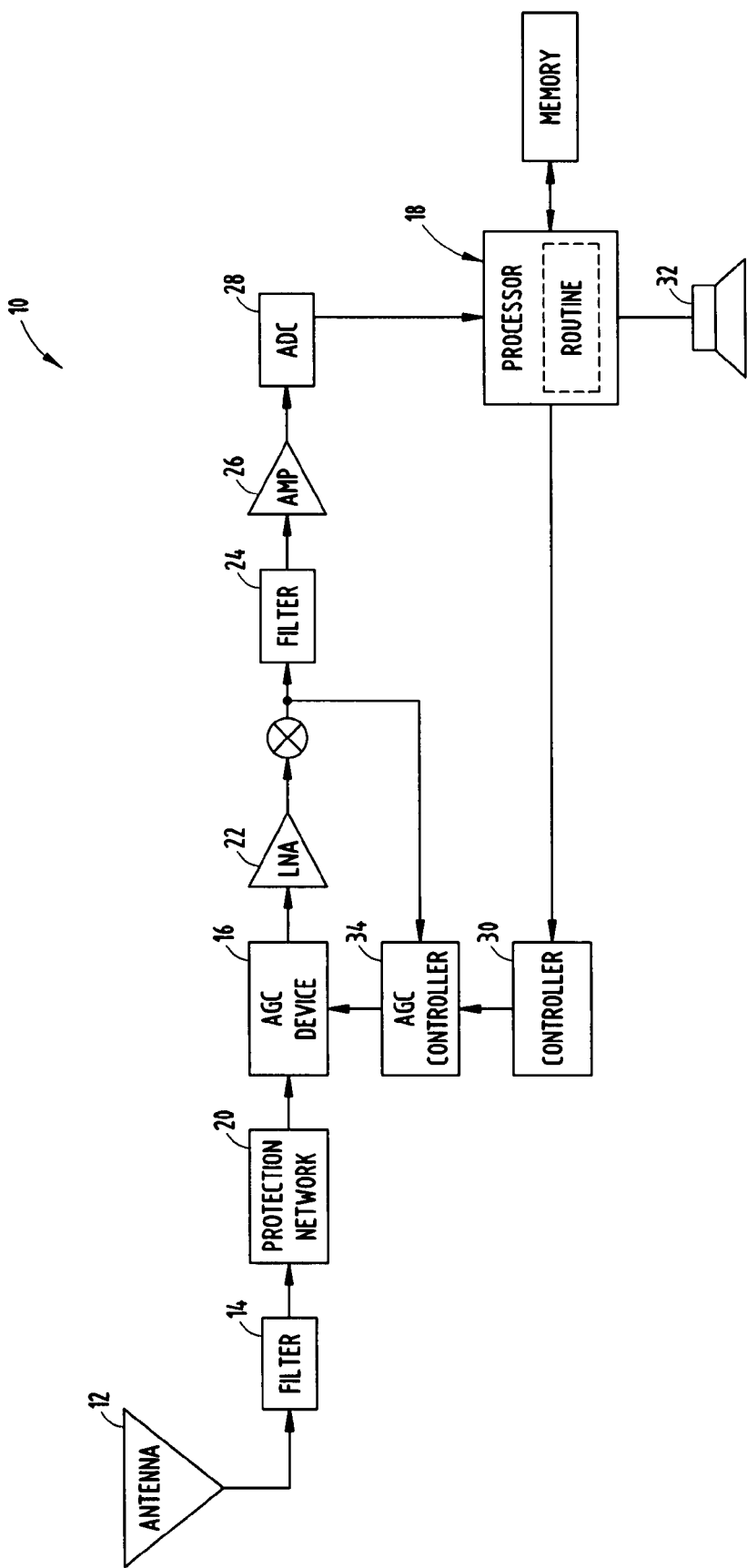
FIG. 1 is a block diagram of a receiver system in accordance with one embodiment of the present invention.

In reference to FIG. 1, a receiver system is generally shown at reference identifier 10, according to one embodiment. The receiver system 10 includes at least one antenna 12 that receives at least one signal, and a filter 14 is in communication with the antenna 12 for filtering low frequency (e.g. 50 hertz (Hz), 60 Hz., or the like) signals. According to a disclosed embodiment, the at-least-one signal includes at least an amplitude modulated (AM) signal, and the filter 14 is a high pass filter. The receiver system 10 further includes at least one automatic gain control (AGC) device 16 in communication with the filter 14. The AGC device 16 is configured to adjust the gain of the signal received by the antenna 12 to attenuate noise in the signal. A processor generally indicated at 18, is in communication with the AGC device 16, and detects when the noise is within a predetermined frequency range. Typically, the processor 18 commands the AGC device 16 if the noise is within the predetermined frequency range in order for the AGC device 16 to attenuate the noise, as described in greater detail herein.

Additionally, the receiver system 10 can include a protection network 20, which can further provide front-end attenuation to attenuate the noise in the signal that is within the predetermined frequency range. Thus, the filter 14 and protection network 20 attenuate the noise in the signal that is within the predetermined frequency range. However, the filter 14 and protection network 20 are generally limited in effectively attenuating noise to a desirable level while providing suitable sensitivity in AM bands, such as, long wave and middle wave signals, according to one embodiment. Also, the filter 14 and protection network 20 typically result in flatness of the in-band frequency response when the received signal is between 120 kilohertz (kHz) and 1710 kHz. For purposes of explanation and not limitation, the filter 14 included in the front-end of the receiver system 10 can typically provide approximately 35 decibels (dB) attenuation of a sixty hertz (60 Hz) signal. Further, the protection network 20 in the front-end of the receiver system 10 provides approximately 3 dB attenuations of a 60 Hz signal.

According to one embodiment, a low noise amplifier (LNA) 22 is in communication with the output of the AGC device 16. Typically, the LNA 22 amplifies the signal received by the antenna 12, after the signal has been filtered and attenuated in order to minimize the amount of noise that is amplified. The receiver system 10 also includes an AM mixer 23, an intermediate frequency (IF) filter 24, and an IF amplifier 26. Typically, the AGC device 16 is a wideband AGC device that attenuates strong incoming radio frequency (RF) signals, such as when the receiver system 10 is within close range of an RF transmitter. The AGC device 16 attenuates the strong RF signal to protect the LNA 22 from overloading. The range of the AGC device 16 is typically set by a frequency response at an input of the AM mixer 23. Generally, if the AGC device 16 is configured to always attenuate signals within a range that includes 50 Hz and 60 Hz, it can create oscillation and a slow response time of the AGC device 16.

An analog-to-digital converter (ADC) 28 is in communication between the IF amplifier 26 and the processor 18. The ADC 28 converts the analog signal communicated from the antenna 12 to a digital signal. The digitized signal is then communicated to the processor 18, wherein the processor 18 processes the digitized signal, as described in greater detail below. The processor 18 emits an output, which can be broadcast as an audio output through at least one audio speaker 32. Another output from the processor 18 is received by the controller 30, which is based upon the detected noise in the signal that is within the predetermined frequency range. Thus, the controller 30 controls an AGC controller 34 based upon the command received from the processor 18, and the AGC controller 34 alters the AGC device 16 to increase or decrease the front-end gain in order to attenuate the noise within the predetermined frequency range in the received signal. According to a disclosed embodiment, the processor 18 is a digital signal processor (DSP), and the processor 18, the controller 30, and an AGC controller 34 communicate through an i2C communication bus.

By way of explanation and not limitation, if the signal received by the antenna 12 includes a desirable portion and an undesirable portion, such as noise at 50 Hz or 60 Hz, and the signal is present at the input of the amplifier 26, attenuating the front-end generally decreases the levels of both the desirable portion and the undesirable portion of the signal. Typically, the affect of receiving the noise and the attenuation is an undesirable signal-to-noise ratio. However, when the level of the undesirable portion of the signal is high enough to cause a distortion in the output emitted by the speaker 32, it is beneficial to attenuate the signal at the front-end of the receiver system 10, especially in regards to the second and third order products of the undesirable portion of the signal. Thus, a 1 decibel (dB) reduction of the undesirable portion results in a 2 dB reduction in the second order product and a 3 dB reduction in the third order product. Front-end attenuation while attenuating the signal, including the desirable portion of the signal, provides for an increased reduction (i.e., 2 dB, 3 dB) in the level of the undesirable portion of the signal.

According to a disclosed embodiment, the receiver system 10 attenuates the signal based upon a comparison of the level of the undesirable portion of the received signal and the level of the desirable portion of the received signal. Thus, the receiver system 10 can linearly control the attenuation, such that the amount of attenuation can be increased when the level of the undesirable portion increases, and the amount of attenuation can decrease when the level of the desirable portion decreases. By controlling the amount of attenuation, the receiver system 10 does not have to apply the same amount of attenuation, without regards to the level of the undesirable portion of the received signal, which can result in attenuating the desirable portion of the signal below levels that can produce a desirable audio output.

Figure 2:
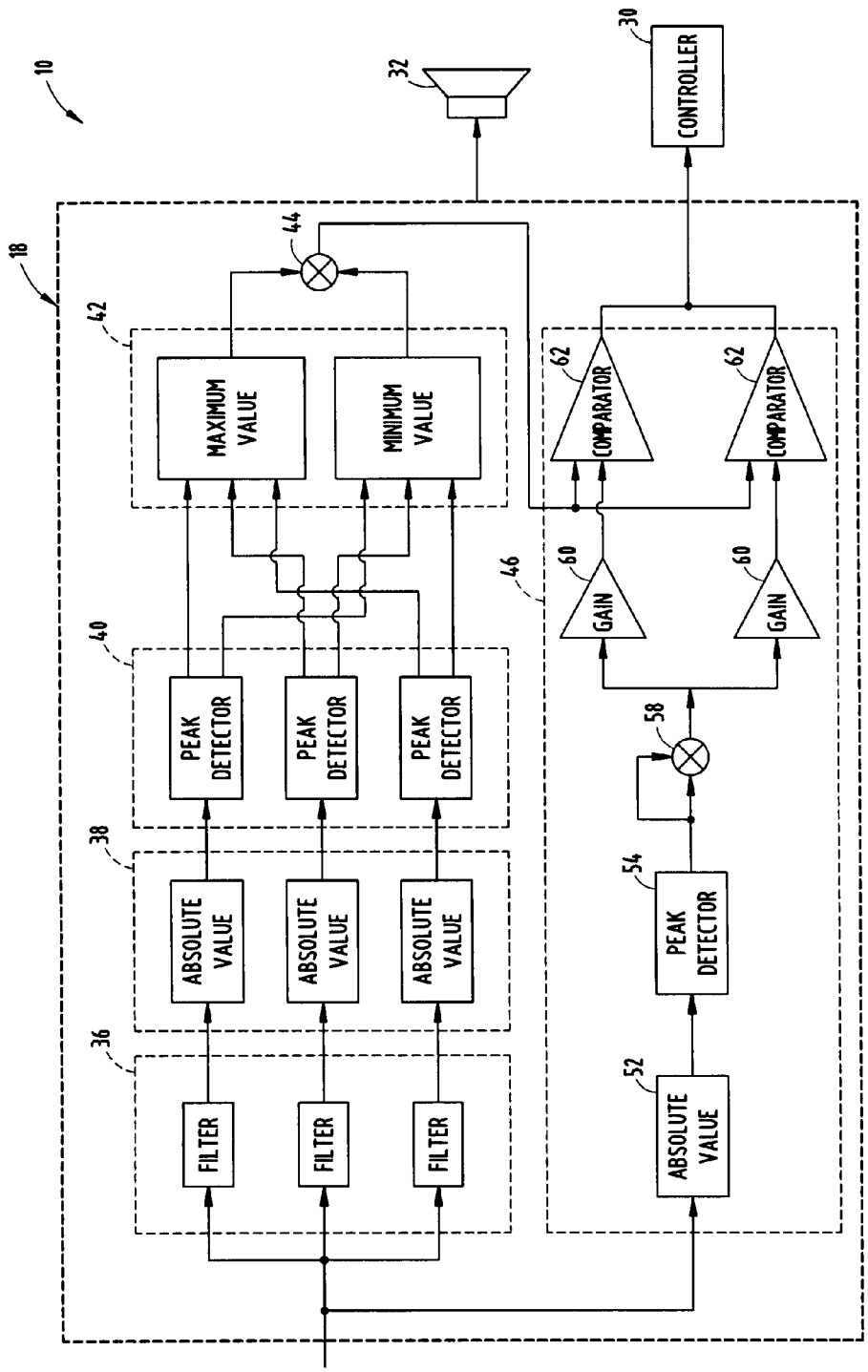
FIG. 2 is a block diagram of processor circuitry in the receiver system in accordance with one embodiment of the present invention.

With reference to FIG. 2, the processor 18, in the form of a DSP, is shown receiving the digitized signal output from the ADC 20. It should be appreciated by those skilled in the art that the processing of the digitized signal can be done using one or more circuit devices or one or more software routines. The processor 18 divides or splits the digitized signal. One division of the digitized signal is split a second time in order to pass the digitized signal through a plurality of digital filters, such that the desirable portion of the digitized signal is removed. By way of explanation and not limitation, the digitized signal is passed through a filter portion 36, which typically includes harmonic filters, and allows the portion of the digitized signal that are multiples of a predetermined frequency range to pass. Examples of the predetermined frequency range and multiples thereof are, but not limited to, approximately 60 Hz, approximately 120 Hz, and approximately 180 Hz. Thus, the filter portion 36 is filtering out the desirable portion of the digitized signal while the noise within the predetermined frequency range remains. In an alternate embodiment, the filter portion 36 is configured such that the predetermined frequency range and multiples thereof are approximately 50 Hz, approximately 100 Hz, and approximately 150 Hz.

The absolute value of the remaining noise output from each filter is obtained by an absolute value portion 38, such that a direct current (DC) representation or value of the digitized signal within each of the frequency bands is obtained. The absolute value or DC representation of the remaining noise then passes through a detection portion 40 in order to determine the signal wave peaks of the digitized signal. According to a disclosed embodiment, the detection portion 40 having peak detectors includes slow attack peak detectors, such that the detectors only react to the input when noise is present in the input for several seconds. Each of the peak detectors in the detection portion 40 emits an output that is received by a comparison portion 42. The comparison portion 42 compares the outputs of the detection portion 40 to determine a maximum value output of the detection portion 40 and a minimum value output of the detection portion 40. The minimum and maximum outputs emitted from the comparison portion 42 are multiplied by the multiplier 44 in order to ensure that the noise within the predetermined frequency range is present.

The processor 18 also includes a portion 46 that determines if front-end attenuation should be applied by the AGC device 16. According to a disclosed embodiment, the portion 46 receives the digitized signal output from ADC 28 and takes the absolute value of the digitized signal using absolute value block 52, such that a DC representation or value of the digitized signal is obtained, which includes the DC representation of the audio or desirable portion of the signal. The absolute value of the digitized signal then passes through a peak detector block 54 to ensure a predetermined period of time has passed where the DC representation is present before an action, such as commanding the AGC device 14 to attenuate noise, is taken. The DC representation is then multiplied by itself with multiplier 58 in order provide a more valid comparison to the output of the multiplier 44, than if the DC representation were not multiplied by itself. Typically, the squared DC representation corresponds to a power level. The gain of the DC representation is then altered using the gain blocks 60, and compared to the output of the multiplier 44 by the comparator blocks 62. According to a one embodiment, the DC representation is compared to the output emitted by the multiplier 44 twice, and two compared outputs are communicated to the controller 30 to determine if the AGC device 16 should attenuate the noise.

By way of explanation and not limitation, if noise, or the multiplier 44 output exceeds the DC representation of the digitized signal, then the controller 30 commands the AGC controller 34 to control the AGC device 16 in order to increase the front-end attenuation to attenuate the noise within the predetermined frequency range in the signal. However, if it is determined that the noise does not exceed the digitized signal, then the controller 30 commands the AGC controller 34 to control the AGC device 16 in order to decrease the front-end attenuation, such that the AGC device 16 does not attenuate the signal since there is minimal noise within the predetermined frequency range in the signal. Thus, processor 18 linearly controls the front-end AGC of the receiver system 10.

Figure 3:
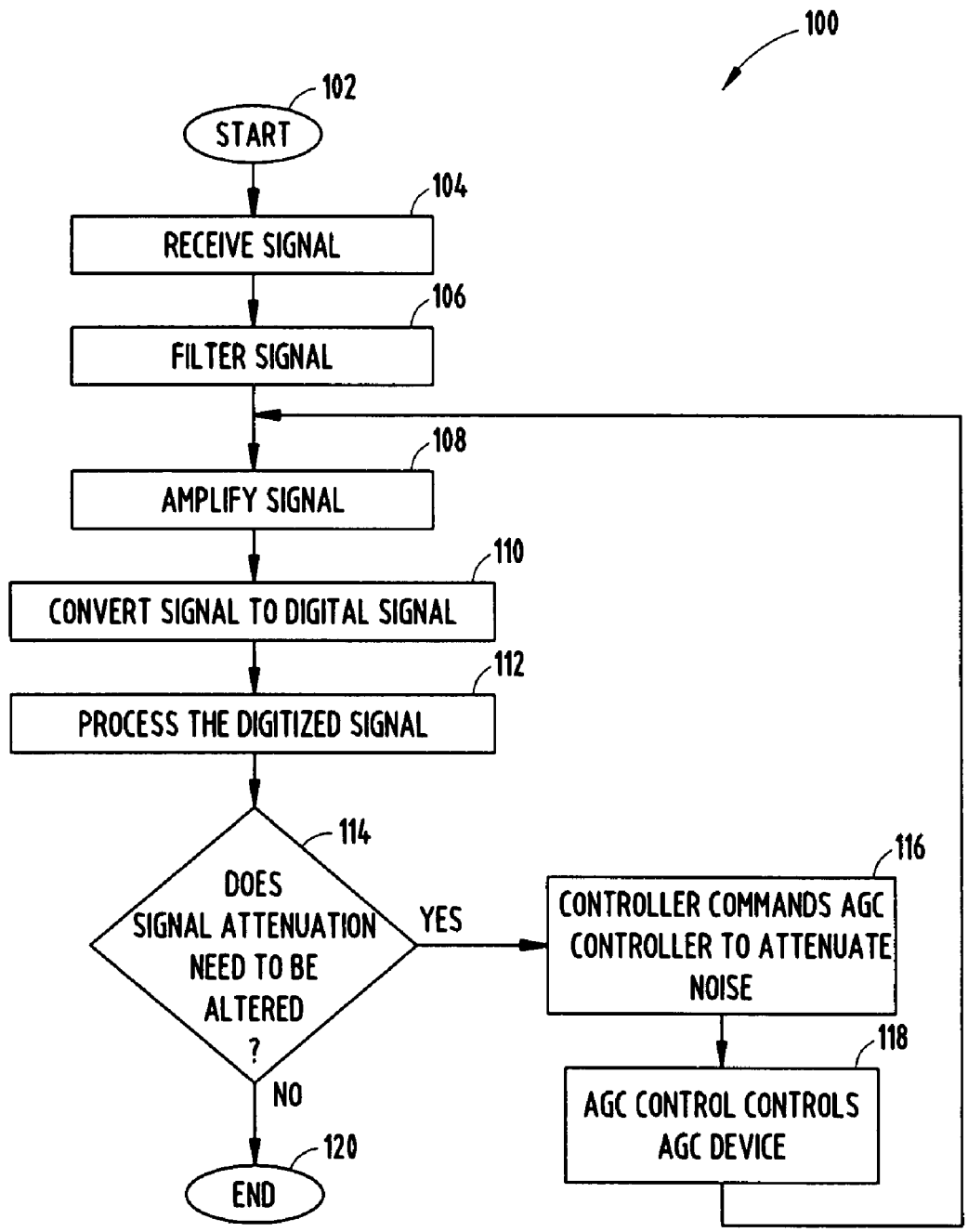
FIG. 3 is a flow chart illustrating a method of processing at least one received signal to attenuate noise within a predetermined frequency range in accordance with one embodiment of the present invention.

In reference to FIGS. 1-3, a method of processing at least one received signal and attenuating noise is generally shown in FIG. 3 at reference identifier 100. The method 100 starts at step 102, and proceeds to step 104 where at least one signal is received. In one embodiment, the at-least-one signal includes at least one AM signal. At step 106, noise is filtered from the signal. The signal then passes through a bandpass filter 14 and protection network 20 to attenuate at least a portion of the undesirable noise in the signal that is within the predetermined frequency range. The filtered signal is amplified using the amplifier 22 at step 108, in order to increase the power of the filtered signal. Typically, a LNA is used to amplify the signal.

The method 100 proceeds to step 110, where the signal is converted to a digital signal by the ADC 28. The digitized signal is processed by the processor 18 at step 112. At decision step 114, it is determined if the signal attenuation needs to be altered. If it is determined at decision step 114 that the signal attenuation needs to be altered, the method 100 proceeds to step 116, where the controller 30 commands the AGC controller 34. At step 118, the AGC controller 34 controls the AGC device 16. According to one embodiment, the AGC device 16 is controlled in order to linearly control or alter the front-end attenuation of noise in the receiver system 10. However, if it is determined at decision step 114 that the signal attenuation does not need to be altered, the method ends at step 120. According to one embodiment, the processor 18 performs steps 112-118, as described in greater detail below.

Figure 4:
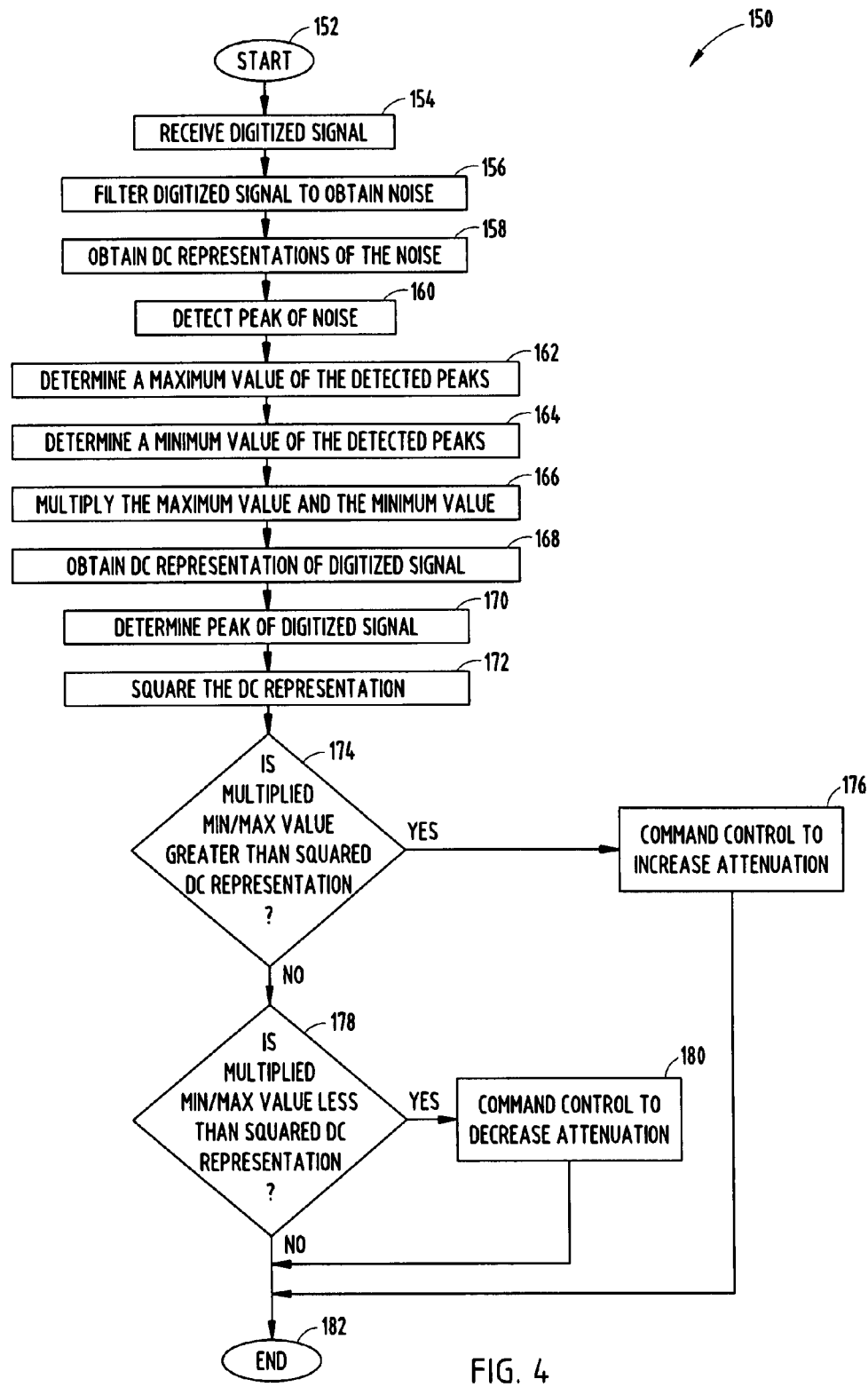
FIG. 4 is a flow chart illustrating a method of processing a digitized signal to control attenuation of a signal received by a receiver system in accordance with one embodiment of the present invention.

With particular reference to FIGS. 1-2 and 4, a method of processing a digitized signal to control attenuation is generally shown in FIG. 4 at reference identifier 150. According to a disclosed embodiment, the method 150 is performed by the processor 18. The method 150 starts at step 152 and proceeds to step 154 where the digitized signal is received by the processor 18. At step 156, the digitized signal is filtered, such that the noise within the predetermined frequency range remains. Typically, the filter portion 36 is used to filter the desirable portion of the signal, such that only noise within the predetermined frequency range, including multiples thereof, remains in the digitized signal.

Peaks of the signal wave of the remaining noise are detected by the detection portion 40 at step 160, and thus, ensuring that the noise is present in the signal for a predetermined period of time. At step 162, a maximum value of the peaks is determined, and at step 164, a minimum value of the peaks is determined. According to a disclosed embodiment, the comparison portion 42 is used to determine the maximum and minimum values. At step 166, the maximum value and the minimum value are multiplied together, typically by the multiplier 44.

The method 150 further includes step 168, where a DC representation or value of the received digitized signal is obtained. A peak of the DC representation is determined at step 170, and the square of the DC representation is obtained at step 172. The method 150 proceeds to decision step 174, where it is determined if the multiplied minimum/maximum (min/max) value is greater than the squared DC representation. If it is determined that the min/max value is greater than the DC representation at decision step 174, then the processor 18 commands the controller 30 to increase the attenuation of the noise in the signal that is within the predetermined range, including multiples thereof. However, if it is determined that the min/max value is less than the DC representation at decision step 174, then the processor 18 commands the controller 30 to decrease the attenuation of the signal. Thus, the AGC device 16 is only used when it is determined that noise within a predetermined frequency range, and multiples thereof, is present.

Figure 5:
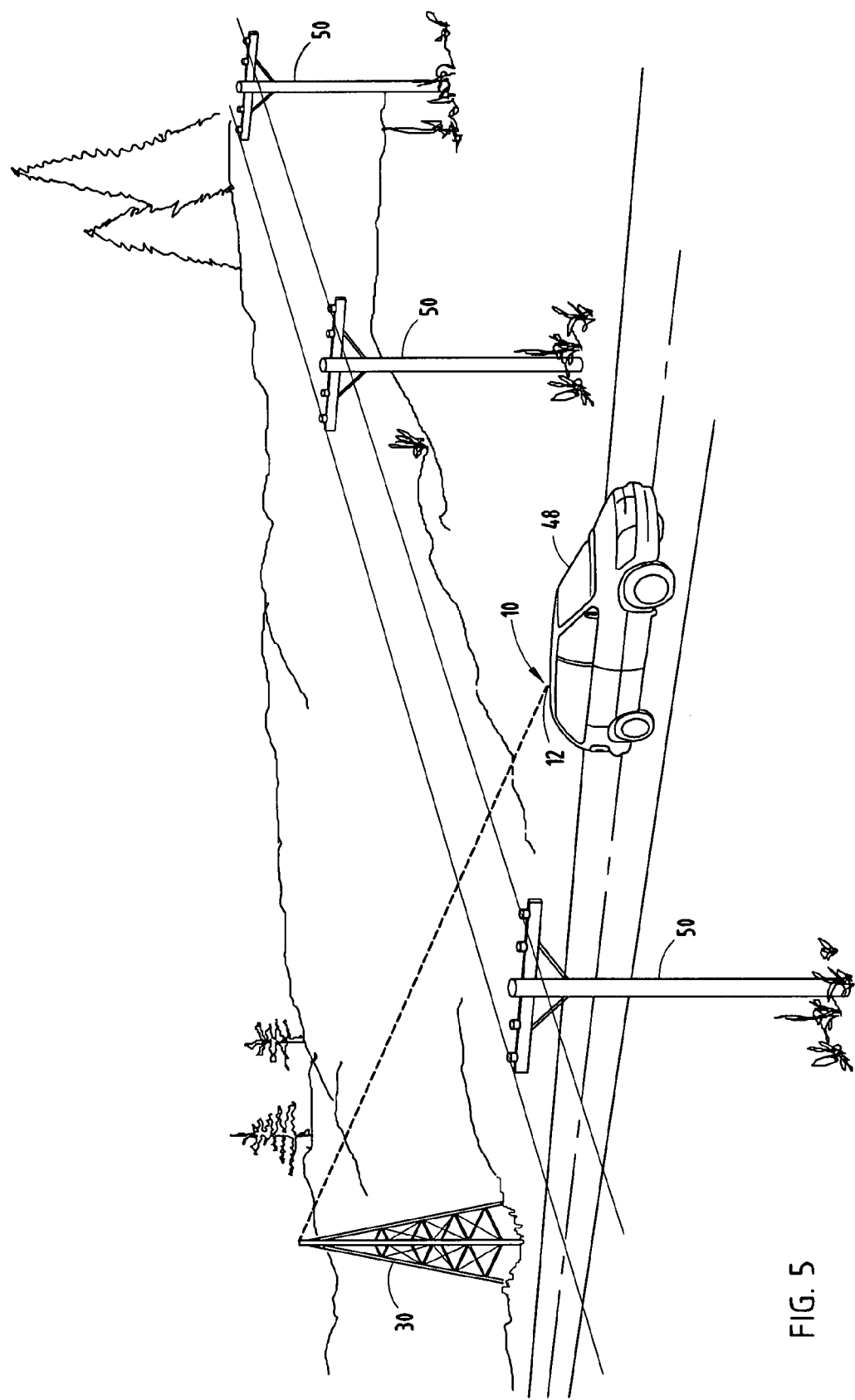
FIG. 5 is an environmental view of a receiver system in accordance with one embodiment of the present invention.

By way of explanation and not limitation, in operation and in reference to FIG. 5, the receiver system 10 can be integrated with a vehicle 48. According to one embodiment, the receiver system 10 is configured to determine if noise at 60 Hz, including multiples thereof, is present, and if noise at 60 Hz is present then to control the AGC device 16 to attenuate the 60 Hz noise. In an alternate embodiment, the receiver system 10 is configured to determine if noise at 50 Hz, including multiples thereof, is present, and if so, to attenuate the 50 Hz noise.

One example of 60 Hz noise, is the electromagnetic interference (EMI) generated by a high voltage power line 50. Thus, when a vehicle 48 passes under the high voltage power line 50, the signal being received by the receiver system 10 includes noise at 60 Hz. The 60 Hz noise generally results in the receiver system operating at undesirable signal-to-noise ratios and emitting an undesirable audio output. Thus, the filter 14 and protection network 20 can be configured to filter out at least a portion of the 60 Hz noise, and the AGC device 16 can be controlled to further attenuate the 60 Hz noise. By controlling the AGC device 16 to only attenuate the received signal when it is determined that 60 Hz noise is present, the AGC applied to the front-end of the receiver system 10 is minimized when the 60 Hz is not present and the greater attenuation is not needed.

Advantageously, the receiver system 10 can increase and decrease the AGC in order to apply greater attenuation when needed due to the amount of noise in the signal, and reduce the amount of attenuation applied to the signal when it is not needed. Thus, the processor 18 and controller 30 can enhance the control of the AGC device 16 by the AGC controller 34. The receiver system 10 achieves greater attenuation of noise in the signal by detecting and increasing the AGC when noise at a predetermined frequency range is present in the signal, than if only filters were used to filter the undesirable noise. Additionally, the AGC device 16 maybe used to attenuate the signal only when it is determined that noise within the predetermined range is present, and thus, the signal is not being attenuated at times when it might otherwise be unnecessary. Further, the AGC device 16 is not limited to functioning within a single frequency band.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

The invention claimed is:

1. A receiver system comprising:
    at least one antenna that receives at least one signal;
    at least one filter in communication with said at least on antenna, wherein said at least one signal passes through said at least one filter;
    at least one automatic gain control device in communication with said at least one filter, wherein said automatic gain control device adjusts the gain of said at least one signal to attenuate noise in said at least one signal; and
    at least one processor in communication with said at least one automatic gain control device, wherein said at least one processor performs the steps comprising:
        detecting when said noise is within a predetermined frequency range, said predetermined frequency range being determined by at least one processor filter; and
        commanding said at least one automatic gain control device to attenuate said noise within said predetermined frequency range when said detected noise is within said predetermined frequency range, such that said automatic gain control device attenuates said noise that is within said predetermined frequency range,
    wherein said predetermined frequency range is one of approximately sixty hertz (60 Hz) and multiples thereof and approximately fifty hertz (50 Hz) and multiples thereof.

2. The receiver system of claim 1, further comprising a controller in communication with said processor and said automatic gain control device, wherein said controller controls said automatic gain control device based upon communication bus commands communicated from said processor in order to linearly control front-end automatic gain control of said receiver system.

3. The receiver system of claim 1, wherein said processor is a digital signal processor.

4. The receiver system of claim 1, further comprising, an analog-to-digital converter (ADC), said processor being in direct downstream communication from said ADC.

5. The receiver system of claim 4, wherein said steps performed by said processor further comprise filtering a desirable portion of said signal and detecting a peak of remaining said noise.

6. A receiver system comprising:
    at least one antenna that receives at least one signal, wherein said at least one signal comprises an amplitude modulated (AM) signal;
    at least one filter in communication with said at least on antenna, wherein said at least one signal passes through said at least one filter;
    at least one automatic gain control device in communication with said at least one filter, wherein said automatic gain control device adjusts the gain of said at least one signal to attenuate noise in said at least one signal; and
    at least one processor in communication with said at least one automatic gain control device, wherein said at least one processor performs the steps comprising:
        detecting when said noise is within a predetermined frequency range;
        commanding said at least one automatic gain control device to attenuate said noise within said predetermined frequency range when said detected noise is within said predetermined frequency range, such that said automatic gain control device attenuates said noise that is within said predetermined frequency range; and
        filtering a desirable portion of said signal and detecting a peak of remaining said noise, and
    an analog-to-digital converter (ADC) in communication with said processor,
    wherein said steps performed by said processor further comprise outputting a maximum output based upon said detected peaks and a minimum output based upon said detected peaks, and multiplying said maximum output and said minimum output.

7. The receiver system of claim 6, wherein said steps performed by said processor further comprise comparing said multiplied output to said digitized signal, and commanding said automatic gain control device based upon said comparison.

8. The receiver system of claim 1, wherein said receiver system is integrated with a vehicle.

9. A method of attenuating noise in at least one received signal with a receiver integrated with a vehicle, said method comprising the steps of:
    receiving said at least one signal, wherein said at least one signal comprises an amplitude modulated (AM) signal;
    filtering undesirable noise from said at least one signal;
    converting said at least one signal to a digital signal;
    filtering desirable portion of said digitized signal;
    detecting a peak of remaining noise at a predetermined frequency in said digitized signal, wherein said predetermined frequency is one of approximately fifty hertz (50 Hz) and multiples thereof and approximately sixty hertz (60 Hz) and multiples thereof;
    outputting a maximum output based upon said detected peaks and a minimum output based upon said detected peaks;
    multiplying said maximum output and said minimum output;
    comparing said multiplied output to said digitized signal; and
    commanding an automatic gain control device to attenuate noise within said predetermined frequency range when said noise is within said predetermined frequency range.

10. The method of claim 9 further comprising the step of increasing attenuation by said automatic gain control device if said correlated output is greater than said digitized signal.

11. The method of claim 9 further comprising the step of decreasing attenuation by said automatic gain control device if said correlated output is less than said digitized signal.

12. The method of claim 9 further comprising the step of providing a controller in communication with said automatic gain control device, wherein said controller controls said automatic gain control device based upon said comparison of said noise and said digitized signal.

13. A receiver system comprising:
   at least one antenna that receives at least one signal;
   at least one filter in communication with said at least on antenna, wherein said at least one signal passes through said at least one filter;
   at least one automatic gain control device in communication with said at least one filter, wherein said automatic gain control device adjusts the gain of said at least one signal to attenuate noise in said at least one signal; and
   at least one processor in communication with said at least one automatic gain control device, wherein said at least one processor performs the steps comprising:
      detecting when said noise is within a predetermined frequency range;
      commanding said at least one automatic gain control device to attenuate said noise within said predetermined frequency range when said detected noise is within said predetermined frequency range, such that said automatic gain control device attenuates said noise that is within said predetermined frequency range; and
      filtering a desirable portion of said signal and detecting a peak of remaining said noise, and
      an analog-to-digital converter (ADC) in communication with said processor,
   wherein said steps performed by said processor further comprise outputting a maximum output based upon said detected peaks and a minimum output based upon said detected peaks, and multiplying said maximum output and said minimum output.

14. A method of attenuating noise in at least one received signal with a receiver, said method comprising the steps of:
   receiving said at least one signal;
   filtering undesirable noise from said at least one signal;
   converting said at least one signal to a digital signal;
   filtering desirable portion of said digitized signal;
   detecting a peak of remaining noise at a predetermined frequency in said digitized signal, wherein said predetermined frequency is one of approximately fifty hertz (50 Hz) and multiples thereof and approximately sixty hertz (60 Hz) and multiples thereof;
   outputting a maximum output based upon said detected peaks and a minimum output based upon said detected peaks;
   multiplying said maximum output and said minimum output;
   comparing said multiplied output to said digitized signal; and
   commanding an automatic gain control device to attenuate noise within said predetermined frequency range when said noise is within said predetermined frequency range.

15. The receiver system of claim 1, wherein the least one signal comprises an amplitude modulated (AM) signal.

16. The receiver system of claim 1, wherein the steps performed by said processor are determined, at least in part, by using said at least one processor filter, and the at least one processor filter comprising at least one harmonic filter.

\* \* \* \* \*